United States Patent [19]

Bardal

[11] Patent Number: 5,757,248
[45] Date of Patent: May 26, 1998

[54] ARRANGEMENT FOR MATCHING AND TUNING A SURFACE ACOUSTIC WAVE FILTER UTILIZING ADJUSTABLE MICROSTRIP LINES

[75] Inventor: Sigmund Bardal, Horten, Norway

[73] Assignee: AME Space As, Horten, Norway

[21] Appl. No.: 669,222

[22] Filed: Jun. 24, 1996

[30] Foreign Application Priority Data

Jun. 28, 1995 [NO] Norway ............................ 952589

[51] Int. Cl.$^6$ .......................... H03H 7/38; H03H 9/48
[52] U.S. Cl. ................ 333/33; 333/26; 333/193; 333/263
[58] Field of Search ............................ 333/25, 26, 33, 333/193, 263

[56] References Cited

U.S. PATENT DOCUMENTS

| | | | |
|---|---|---|---|
| 3,965,445 | 6/1976 | Ou | 333/33 |
| 4,460,877 | 7/1984 | Sterns | 333/26 |
| 4,625,184 | 11/1986 | Niitsuma et al. | 333/193 |
| 4,686,492 | 8/1987 | Grellman et al. | 333/33 |
| 4,725,792 | 2/1988 | Lampe, Jr. | 333/26 |
| 4,870,376 | 9/1989 | Wagers | 333/150 |
| 5,045,743 | 9/1991 | Furukawa | 310/313 D |
| 5,148,130 | 9/1992 | Dietrich | 333/26 |
| 5,384,558 | 1/1995 | Maruhashi | 333/33 |

FOREIGN PATENT DOCUMENTS 907666  2/1954  Germany .

*Primary Examiner*—Robert Pascal
*Assistant Examiner*—Barbara Summons
*Attorney, Agent, or Firm*—Frishauf, Holtz, Goodman, Langer & Chick

[57] ABSTRACT

A matching arrangement matches and turns the impedance of a high frequency surface acoustic wave (SAW) filter (3) to the characteristic impedance of an external system. The arrangement includes a power divider/combiner (9,10) with 180 degrees phase difference between the two output ports of the divider—or input ports of the combiner—and an adjustable capacitor (15, 24) installed between the power divider/combiner (9,10) and the SAW-filter (3). The arrangement may be a microstrip network where the power divider/combiner includes a Wilkinson-divider (9,10) in combination with a 180 degrees phase-shift (11,12) between the output arms (13, 14; 20, 21) of the divider (9,10).

12 Claims, 2 Drawing Sheets

ARRANGEMENT FOR MATCHING AND TUNING A SURFACE ACOUSTIC WAVE FILTER UTILIZING ADJUSTABLE MICROSTRIP LINES

BACKGROUND OF THE INVENTION

FIELD OF THE INVENTION

The present invention relates to an arrangement for matching and tuning a Surface Acoustic Wave filter (SAW-filter) to the characteristic impedance $Z_0$ of an external system, in order to reduce reflection losses. Typically $Z_0=50$ ohms. The SAW-filters normally have a high impedance (capacitive) The arrangement includes a power divider/combiner with 180 degrees phase difference between the two output ports of the divider—or input ports of the combiner.

The insertion-loss of the filter is very sensitive to loss in the matching network due to its high Q-value. Additional requirements are simplicity in tuning and manufacturability. Tuning of the matching network is required due to manufacturing variations in the SAW filter impedance.

At lower frequencies (<500 MHz) various L or Pi networks are used, —consisting of capacitors, inductors and possibly resistors. The main principle of the prior art arrangements is to compensate for the SAW-filter capacitance by either a shunt or a series inductor, and normally with an additional transformation of the resulting real impedance into the characteristic impedance $Z_0$. Tuning is normally accomplished by adjusting the windings of one or more inductors.

Solutions utilizing inductors become lossy at higher frequencies (>500 MHz). This is true particularly when using high-permeability materials which normally is required in order to confine the magnetic fields such that direct magnetic coupling between input and output of the filter is minimized (RF-isolation). In addition, —parasitic effects are relatively difficult to predict with high accuracy. There is also a modelling difficulty related to the definition of a groundplane of the matching network.

SUMMARY OF THE INVENTION

The object of the present invention is to provide a matching system for SAW-filters, particularly in the high-frequency range above 500 MHz.

The basic idea of the invention is to avoid inductors by transforming the SAW-filter impedance, and compensating the transformed impedance with a shunt capacitor. The solution is realized with no via-holes and ground-connections from the substrate or PCB.

One of the main features of the invention is that the arrangement includes adjustable capacitor means installed between a power divider/combiner and a surface acoustic wave (SAW) filter, —for matching and tuning the impedance of the SAW filter to the characteristic impedance of an external system.

The capacitor means is not itself adjustable. In one embodiment, the position of the capacitor is adjusted to different positions. In a further embodiment, the capacitor has a fixed position but bond wires are adjusted to simulate different mounting positions of the capacitor.

In a preferred embodiment, the object of the invention is achieved by a microstrip unbalanced to balanced conversion based on a standard Wilkinson-divider in combination with a 180 degrees phase-shift between the two output arms of the divider.

BACKGROUND

It is well known in the prior art—such as e.g. U.S. Pat. No. 4,870,376—to use Wilkinson combiners and microstrip line arrangements in connection with SAW components. Said U.S. patent, however, relates to monolithic elastic convolver output circuits, and does not apply to matching and tuning of SAW-filter transducers.

U.S. Pat. No. 4,460,877 relates to a broad-band printed-circuit balun employing coupled-strip all pass filters. One embodiment of balun (balanced/unbalanced device) disclosed therein employs a Wilkinson power divider/combiner.

The following advantages are obtained by the present invention over the above mentioned prior art:

Matching of high-frequency SAW-filters minimizing excess losses.

Simple manufacturing and tuning.

No inductors and ground-connections (only the substrate/PCB groundplane, no vias), ensures straightforward and accurate simulation and realization.

Due to the balanced nature of the SAW filter feeding, the problem with direct electromagnetic coupling between input and output is minimized.

DRAWINGS

DETAILED DESCRIPTION

Figure 1:
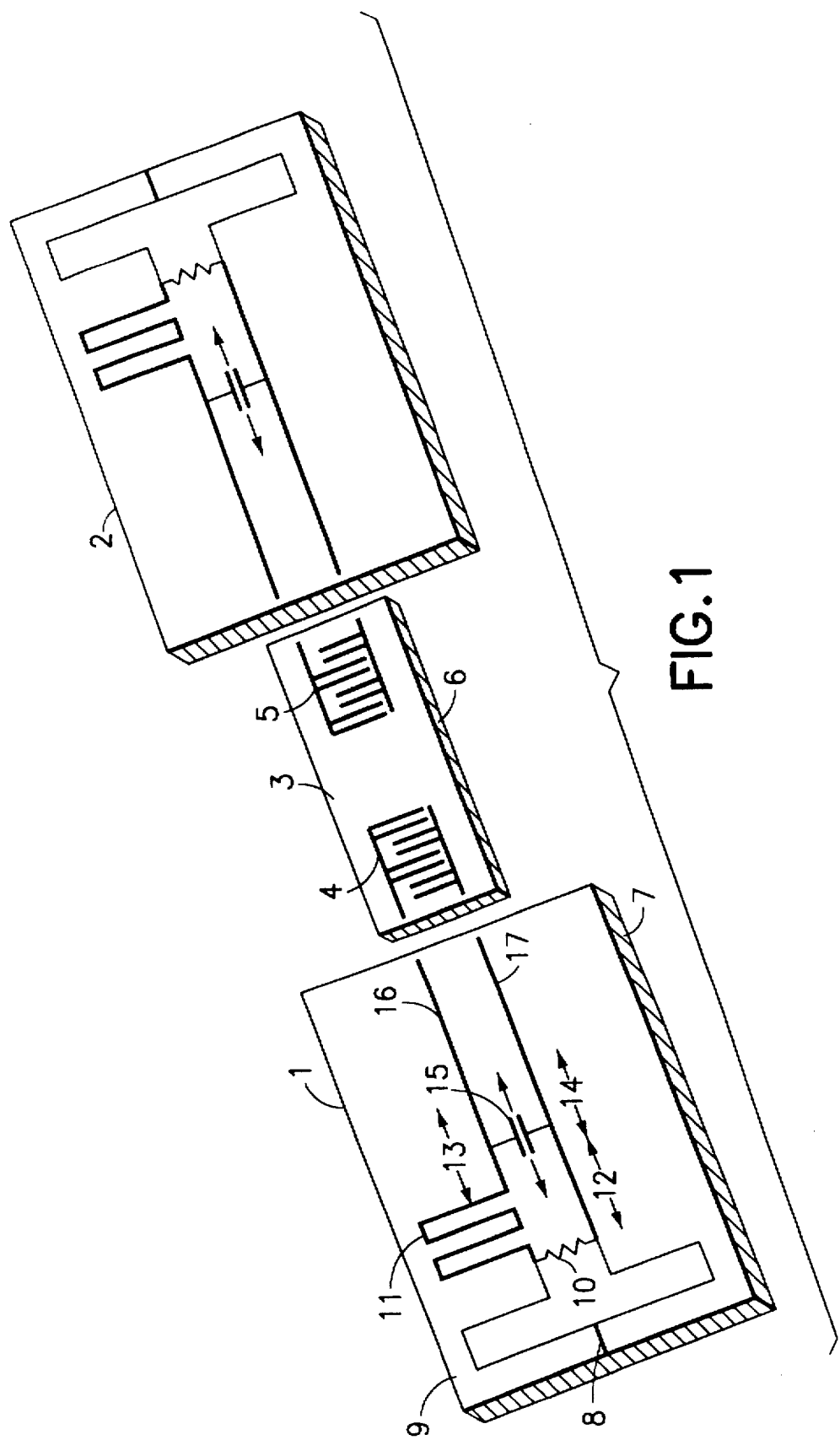
FIG. 1 illustrates a first embodiment of the invention.

In FIG. 1—which is not drawn to scale—1 and 2 are input and output matching networks whereas 3 is a SAW-filter comprising interdigital transducers 4 and 5, arranged on a piezoelectric crystal 6. Interconnections from networks 1 and 2 to SAW-filter 3 are not illustrated. The input and output matching networks are identical except for the interchange of input and output ports, i.e. the output network 2 is a mirrored version of the input network 1. Hence a description is only given of the input network 1.

The input matching network comprises of a substrate 7 of ceramic or PCB materials. A metal pattern forms microstrip lines with characteristic impedances described below. The variation in thickness of the various drawn lines indicates a difference in impedance. The input microstrip 8 has the same characteristic impedance $Z_0$ as the output impedance of external circuitry. A Wilkinson-divider 9 comprises two microstrip arms with characteristic impedance $\sqrt{2}\,Z_0$, each of the arms having a physical length corresponding to a 90 degrees phase shift, and a resistor 10, wherein $R=2Z_0$. At the output of the Wilkinson-divider there is a 180 degrees phase-shifter. This comprises two microstrip lines 11 and 12, with characteristic impedance $Z_0$ and a difference in physical length corresponding to a 180 degrees phase-shift.

The function of the Wilkinson-divider is to convert from unbalanced to balanced feeding of the SAW-filter. This can be achieved with any power-divider with a 180 degrees phase shift. Two microstrip lines 13 and 14 of characteristic impedance $Z_0$ are the first part of the lines connecting the phase-shifter to the SAW filter. These two lines are parallel and have a separation corresponding to the length of the capacitor 15, which connects these lines. The length of lines 13 and 14 is the range where the capacitor can be positioned. The length of the remaining part of the microstrip lines connecting the phase-shifter to the SAW filter, 16 and 17, is determined by the SAW-filter impedance, the characteristic impedance and the operating frequency of the SAW filter. These lines, which are shown as straight lines, can be given an arbitrary path as long as they have the same length.

Tuning of the matching network is performed by adjusting the position of the capacitor along the two lines 13 and 14, before fixing it in the correct position.

Figure 2:
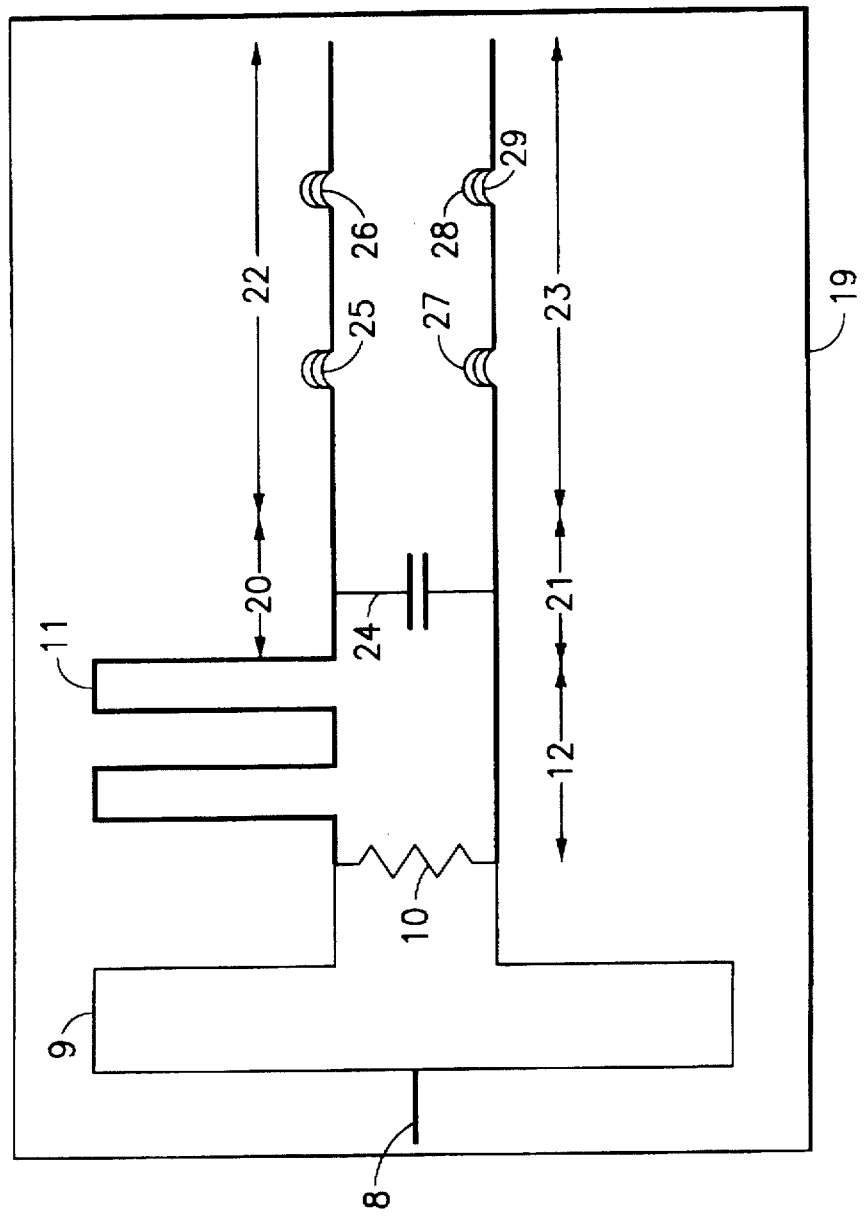
FIG. 2 illustrates a second embodiment of the invention.

In FIG. 2, a matching network 19 illustrates a second embodiment of the invention. The reference numbers 8–12 show components which are identical to the components described in connection with FIG. 1. Leading from lines 11 and 12 are microstrip lines 20/22 and 21/23 as indicated. These lines, which are shown as straight lines in FIG. 2, can be given an arbitrary path as long as they have the same length. A fixed capacitor 24 is positioned between lines 20 and 21. A number of gaps 25–28 are arranged in the lines 22 and 23. Each of the gaps is bridged with a number (2–5) of bond wires 29.

Tuning of the matching network is done by cutting one or more of the bond wires 29 of one or more of the bridged gaps 25–28. This corresponds to changing the effective electrical length of the lines 22 and 23, and therefore performs the same function as moving the capacitor as described in connection with FIG. 1.

Consider an example where the line segments (22,23) are 50 ohms, with one gap in each segment, and with each gap being bridged by two bond-wires. If the bond-wires are 2 mm long and have a diameter of 0.025 mm, cutting one of the bond-wires in each gap gives an increased electrical length corresponding to a lateral shift of the capacitor by 0.2 mm. The bond wires could be 1–3 mm long with a diameter of 0.01–0.1 mm.

The above mentioned embodiments of this invention must be taken as examples only and should not be considered as limitations on the scope of protection. For example, the characteristic impedance of the microstrip lines (11,12,13, 14,16,17) can have a different value than $Z_0$, such as $Z_1$, as long as the characteristic impedance of the arms of the Wilkinson-divider 9 is changed accordingly, so that $Z_1$ is transformed into $Z_0$ at the Wilkinson-divider input 8.

I claim:

1. A matching arrangement including a power divider/combiner with a 180 degrees phase difference between one of (i) output ports of the divider and (ii) input ports of the combiner, said matching arrangement comprising:

a capacitance, installed between the power divider/combiner and a surface acoustic wave (SAW) filter, for matching and tuning an impedance of the SAW filter to a characteristic impedance of an external system, said capacitance including a capacitor having a fixed position arranged between two parallel microstrip lines having adjustable lengths for simulating different mounting positions of said capacitor.

2. The matching arrangement according to claim 1, wherein said power divider/combiner comprises a Wilkinson-divider and a 180 degrees phase-shifter between output arms of the Wilkinson-divider.

3. The matching arrangement according to claim 2, comprising a number of bond wires provided to bridge gaps in the microstrip lines, and wherein the adjustability of the lengths of microstrip lines is achieved by manipulating the bond wires.

4. The matching arrangement according to claim 3, wherein said microstrip lines each include a 50 ohm line segment with one gap in each line segment, said gaps being bridged by at least two bond wires having a length of 1–3 mm and a diameter of 0.01–0.1 mm.

5. The matching arrangement according to claim 1, comprising a number of bond wires provided to bridge gaps in the microstrip lines, and wherein the adjustability of the lengths of microstrip lines is achieved by manipulating the bond wires.

6. The matching arrangement according to claim 5, wherein said microstrip lines each include a 50 ohm line segment with one gap in each line segment, said gaps being bridged by at least two bond wires having a length of 1–3 mm and a diameter of 0.01–0.1 mm.

7. A matching arrangement including a power divider/combiner with a 180 degrees phase difference between one of (i) output ports of the divider and (ii) input ports of the combiner, said matching arrangement comprising:

an adjustable capacitor means, installed between the power divider/combiner and a surface acoustic wave (SAW) filter, for matching and tuning an impedance of the SAW filter to a characteristic impedance of an external system, said adjustable capacitor means having a fixed position arranged between two parallel microstrip lines having adjustable lengths for simulating different mounting positions of said capacitor means.

8. The matching arrangement according to claim 7, wherein said power divider/combiner comprises a Wilkinson-divider and a 180 degree phase-shifter between output arms of the Wilkinson-divider.

9. The matching arrangement according to claim 8, comprising a number of bond wires provided to bridge gaps in the microstrip lines, and wherein the adjustability of the lengths of microstrip lines is achieved by manipulating the bond wires.

10. The matching arrangement according to claim 9, wherein said microstrip lines each include a 50 ohm line segment with one gap in each line segment, said gaps being bridged by at least two bond wires having a length of 1–3 mm and a diameter of 0.01–0.1 mm.

11. The matching arrangement according to claim 7, comprising a number of bond wires provided to bridge gaps in the miscrostrip lines, and wherein the adjustability of the lengths of microstrip lines is achieved by manipulating the bond wires.

12. The matching arrangement according to claim 11, wherein said microstrip lines each include a 50 ohm line segment with one gap in each line segment, said gaps being bridged by at least two bond wires having a length of 1–3 mm and a diameter of 0.01–0.1 mm.

* * * * *